(12) United States Patent
Nakamura

(10) Patent No.: US 11,470,741 B2
(45) Date of Patent: Oct. 11, 2022

(54) COOLING SYSTEM, MODULE, AND DEVICE

(71) Applicant: NEC Platforms, Ltd., Kawasaki (JP)

(72) Inventor: Yasuhito Nakamura, Kanagawa (JP)

(73) Assignee: NEC Platforms, Ltd., Kanagawa (JP)

( * ) Notice: Subject to any disclaimer, the term of this patent is extended or adjusted under 35 U.S.C. 154(b) by 238 days.

(21) Appl. No.: 16/756,753

(22) PCT Filed: Jul. 24, 2018

(86) PCT No.: PCT/JP2018/027740
§ 371 (c)(1),
(2) Date: Apr. 16, 2020

(87) PCT Pub. No.: WO2019/077828
PCT Pub. Date: Apr. 25, 2019

(65) Prior Publication Data
US 2021/0195796 A1    Jun. 24, 2021

(30) Foreign Application Priority Data

Oct. 20, 2017  (JP) .............................. JP2017-203473

(51) Int. Cl.
*H05K 7/20* (2006.01)
*F28F 9/02* (2006.01)

(52) U.S. Cl.
CPC ....... *H05K 7/20272* (2013.01); *F28F 9/0246* (2013.01); *F28F 9/0275* (2013.01); *H05K 7/20763* (2013.01)

(58) Field of Classification Search
None
See application file for complete search history.

(56) References Cited

U.S. PATENT DOCUMENTS

| | | | |
|---|---|---|---|
| 9,746,109 B2 * | 8/2017 | Ellsworth, Jr. | ......... F16L 11/10 |
| 11,029,095 B2 * | 6/2021 | Penny | ....................... F28D 7/14 |
| 2010/0002393 A1 * | 1/2010 | Campbell | .......... H05K 7/20772 |
| | | | 361/699 |
| 2013/0043775 A1 * | 2/2013 | Chen | .................. H05K 7/20781 |
| | | | 165/177 |
| 2014/0124168 A1 | 5/2014 | Dean et al. | |

(Continued)

FOREIGN PATENT DOCUMENTS

| | | |
|---|---|---|
| CN | 105704989 A | 6/2016 |
| JP | 2004-246649 A | 9/2004 |

(Continued)

OTHER PUBLICATIONS

International Search Report for PCT/JP2018/027740 dated Oct. 16, 2018 (PCT/ISA/210).

(Continued)

*Primary Examiner* — Courtney L Smith
(74) *Attorney, Agent, or Firm* — Sughrue Mion, PLLC

(57) ABSTRACT

A cooling system including a cooling unit that cools a heat-generating component; a supply connection tube that is connected to the cooling unit and that supplies a cooling medium to the cooling unit; and a discharge connection tube that is connected to the cooling unit and that discharges the cooling medium from the cooling unit, wherein the supply connection tube and the discharge connection tube have different lengths.

8 Claims, 7 Drawing Sheets

(56) References Cited

U.S. PATENT DOCUMENTS

| | | | |
|---|---|---|---|
| 2014/0334092 A1* | 11/2014 | Tang | H05K 7/20772 |
| | | | 165/104.19 |
| 2017/0303432 A1* | 10/2017 | Matsunaga | H05K 7/20 |
| 2018/0313612 A1* | 11/2018 | Nakamura | H05K 7/20 |
| 2018/0320982 A1* | 11/2018 | Nakamura | F28D 15/0275 |

FOREIGN PATENT DOCUMENTS

| | | | |
|---|---|---|---|
| JP | 2010-244546 A | 10/2010 | |
| JP | 2013-038448 A | 2/2013 | |
| JP | 2018-074100 A | 5/2018 | |

OTHER PUBLICATIONS

Extended European Search Report for EP Application No. EP18869196.8 dated Jun. 28, 2021.
Michael Woodacre, "SGI Update: Capability system with interconnect for global addressability and hardware collectives", 15th Workshop on High Performance Computing in Meteorology, Oct. 1-5, 2012, Jan. 1, 2012 (Jan. 1, 2012), pp. 1-27, XP055258255, US Retrieved from the Internet: URL:https://web.archive.org/web/20140217235716/http://www.ecmwf.int/newsevents/meetings/workshops/2012/high_performance_computing_15th/Presentations/pdf/Woodacre.pdf [retrieved on Mar. 15, 2016].

\* cited by examiner

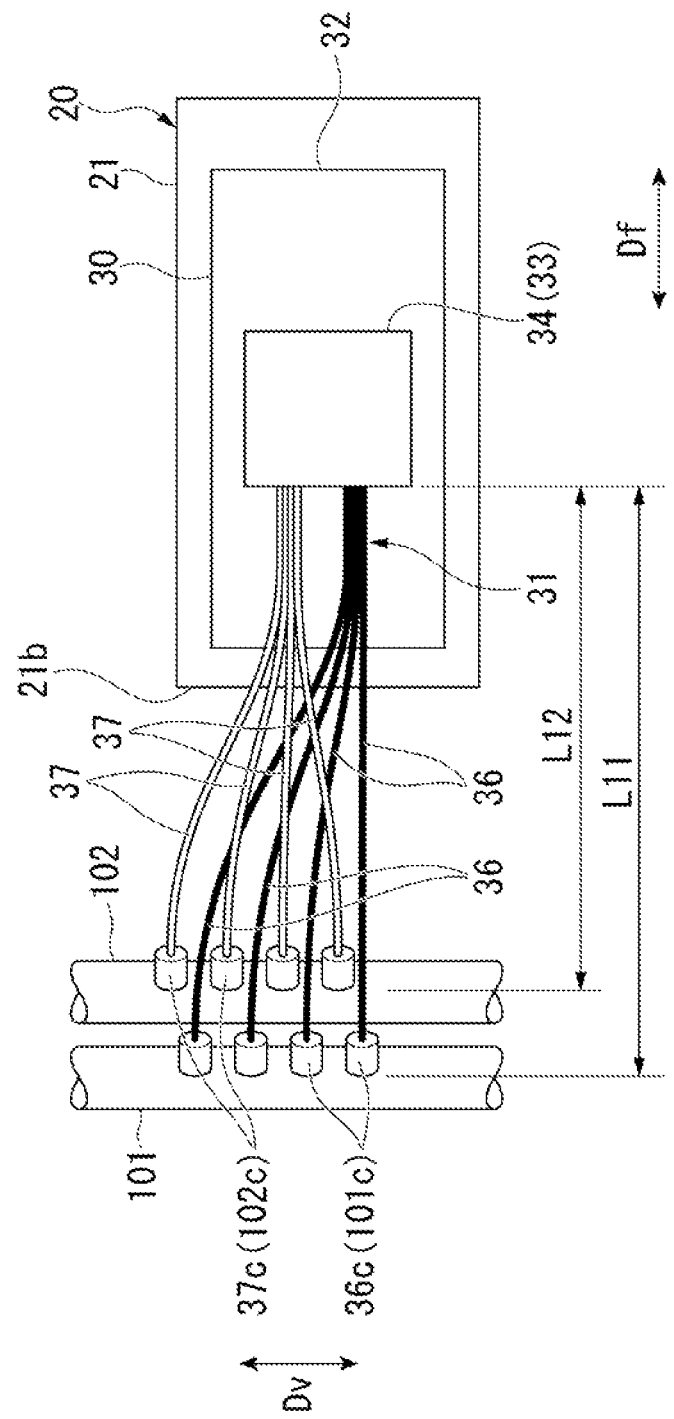

COOLING SYSTEM, MODULE, AND DEVICE

CROSS REFERENCE TO RELATED APPLICATIONS

This application is a National Stage of International Application No. PCT/JP2018/027740 filed Jul. 24, 2018, claiming priority based on Japanese Patent Application No. 2017-203473 filed Oct. 20, 2017, the disclosure of which is incorporated herein in its entirety by reference.

TECHNICAL FIELD

The present invention relates to a cooling system, a module, and a device.

BACKGROUND ART

Patent Document 1 discloses a rack for enclosure liquid-cooled electronic units. The rack comprises fluid connectors for supplying and discharging coolant with respect to the electronic units. The electronic units comprise unit-side fluid connectors that are connected to the fluid connectors in the rack. The unit-side fluid connectors are configured so that supply-side connectors and discharge-side connectors are inserted and withdrawn together with respect to the fluid connectors in the rack.

CITATION LIST

Related Literature

[Patent Document 1]
Japanese Unexamined Patent Application, First Publication No 2013-38448

SUMMARY OF INVENTION

Problem to be Solved by the Invention

However, Patent Document 1 does not disclose a configuration in which the supply-side connectors and the discharge-side connectors are separately inserted and withdrawn. Therefore, it does not disclose, in a configuration in which the supply-side connectors and the discharge-side connectors can be separately inserted and withdrawn, a configuration for preventing erroneous connections of the supply-side connectors and the discharge-side connectors.

Therefore, the present invention provides a cooling system, a module, and a device that prevent erroneous connections of supply connection tubes and discharge connection tubes in a structure in which the supply connection tubes and the discharge connection tubes can be independently inserted and withdrawn.

Means for Solving the Problem

The cooling system according to the present invention includes a cooling unit that cools a heat-generating component; a supply connection tube that is connected to the cooling unit and that supplies a cooling medium to the cooling unit; and a discharge connection tube that is connected to the cooling unit and that discharges the cooling medium from the cooling unit, wherein the supply connection tube and the discharge connection tube have different lengths.

The module according to the present invention includes a substrate on which a heat-generating component is provided; a cooling unit that cools the heat-generating component; a supply connection tube that is connected to the cooling unit and that supplies a cooling medium to the cooling unit; and a discharge connection tube that is connected to the cooling unit and that discharges the cooling medium from the cooling unit, wherein the supply connection tube and the discharge connection tube have different lengths.

The device according to the present invention includes the module as described above; a supply tube to which the supply connection tube is connected; and a discharge tube to which the discharge connection tube is connected; wherein the supply tube and the discharge tube are provided at positions such that a distance between the cooling unit and the supply tube and a distance between the cooling unit and the discharge tube are different.

Advantageous Effects of Invention

The cooling system, module, and device of the present invention prevent erroneous connections of supply connection tubes and discharge connection tubes in a structure in which the supply connection tubes and the discharge connection tubes can be independently inserted and withdrawn.

BRIEF DESCRIPTION OF DRAWINGS

FIG. 8 is a side section view illustrating the structure of the server device according to the fourth embodiment.

DESCRIPTION OF EMBODIMENTS

Multiple embodiments of the present invention will be explained below with reference to the drawings. However, regarding the present embodiments, the portions that are identical to the aforementioned conventional example will be referred to by using the same names, and their explanations will be omitted.

First Embodiment

Figure 1:
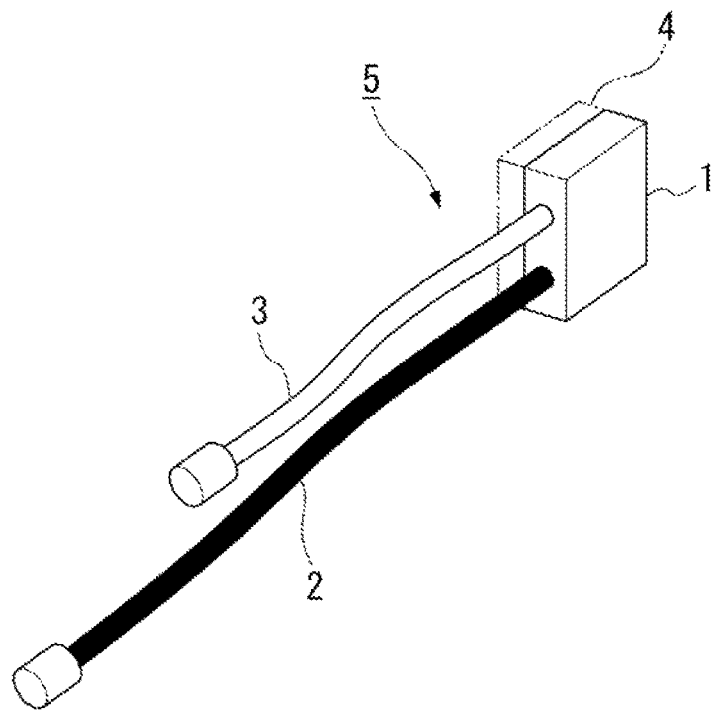
FIG. 1 is a diagram illustrating the minimum structure of a cooling system according to a first embodiment.

FIG. 1 is a diagram illustrating the minimum structure of a cooling system according to a first embodiment.

As illustrated in this drawing, it is sufficient for the cooling system 5 to comprise at least a cooling unit 1, a supply connection tube 2 and a discharge connection tube 3.

The cooling unit 1 cools a heat-generating component 4.

The supply connection tube 2 is connected to the cooling unit 1. The supply connection tube 2 supplies a cooling medium to the cooling unit 1.

The discharge connection tube 3 is connected to the cooling unit 1. The discharge connection tube 3 discharges the cooling medium from the cooling unit 1.

The supply connection tube 2 and the discharge connection tube 3 have mutually different lengths.

In this cooling system 5, the supply connection tube 2 and the discharge connection tube 3 have different lengths, so it is possible to easily and reliably distinguish between the supply connection tube 2 and the discharge connection tube 3 visually. Thus, it is possible to suppress situations in which the supply connection tube 2 and the discharge connection tube 3 are misrecognized and confused with each other. Therefore, in a structure in which the supply connection tube 2 and the discharge connection tube 3 can be independently inserted and withdrawn, it is possible to prevent erroneous connections of the supply connection tube 2 and the discharge connection tube 3.

Second Embodiment

Figure 2:
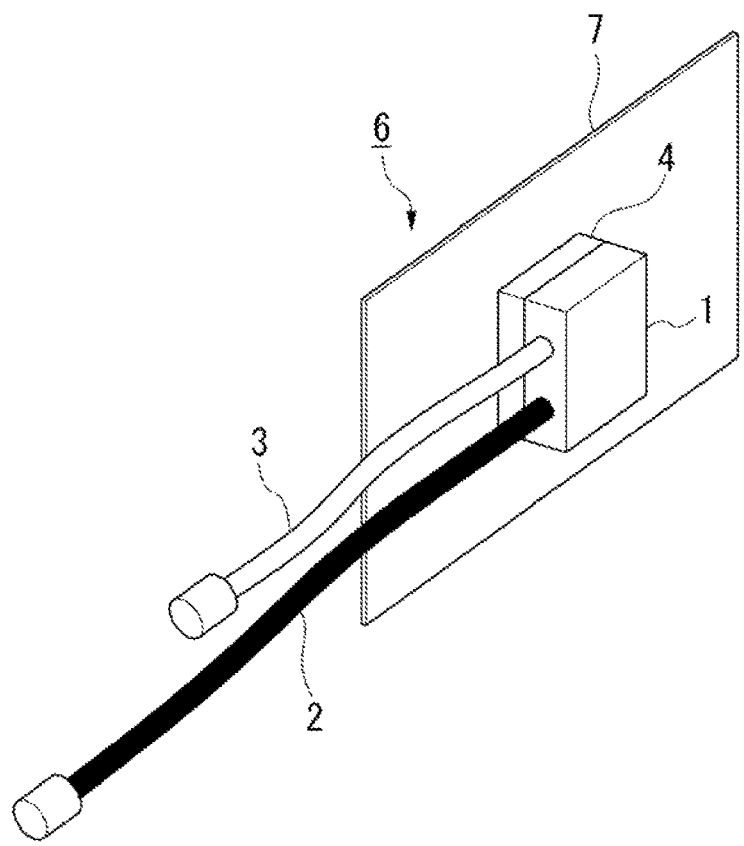
FIG. 2 is a diagram illustrating the minimum structure of a module according to a second embodiment.

FIG. 2 is a diagram illustrating the minimum structure of a module according to a second embodiment.

As illustrated in this drawing, it is sufficient for the module 6 to comprise at least a substrate 7, a cooling unit 1, a supply connection tube 2 and a discharge connection tube 3.

A heat-generating component 4 is mounted on the substrate 7. The cooling unit 1 cools the heat-generating component 4.

The supply connection tube 2 is connected to the cooling unit 1. The supply connection tube 2 supplies a cooling medium to the cooling unit 1.

The discharge connection tube 3 is connected to the cooling unit 1. The discharge connection tube 3 discharges the cooling medium from the cooling unit 1.

The supply connection tube 2 and the discharge connection tube 3 have mutually different lengths.

In this module 6, the supply connection tube 2 and the discharge connection tube 3 have different lengths, so the supply connection tube 2 and the discharge connection tube 3 can be easily and reliably distinguished visually. Thus, it is possible to suppress situations in which the supply connection tube 2 and the discharge connection tube 3 are misrecognized and confused with each other. Therefore, in a structure in which the supply connection tube 2 and the discharge connection tube 3 can be independently inserted and withdrawn, it is possible to prevent erroneous connections of the supply connection tube 2 and the discharge connection tube 3.

Regarding the above-described first and second embodiments, FIG. 1 and FIG. 2 illustrate the supply connection tube 2 as being longer than the discharge connection tube 3, but there is no such limitation. The discharge connection tube 3 may be made longer than the supply connection tube 2.

Third Embodiment

Figure 3:
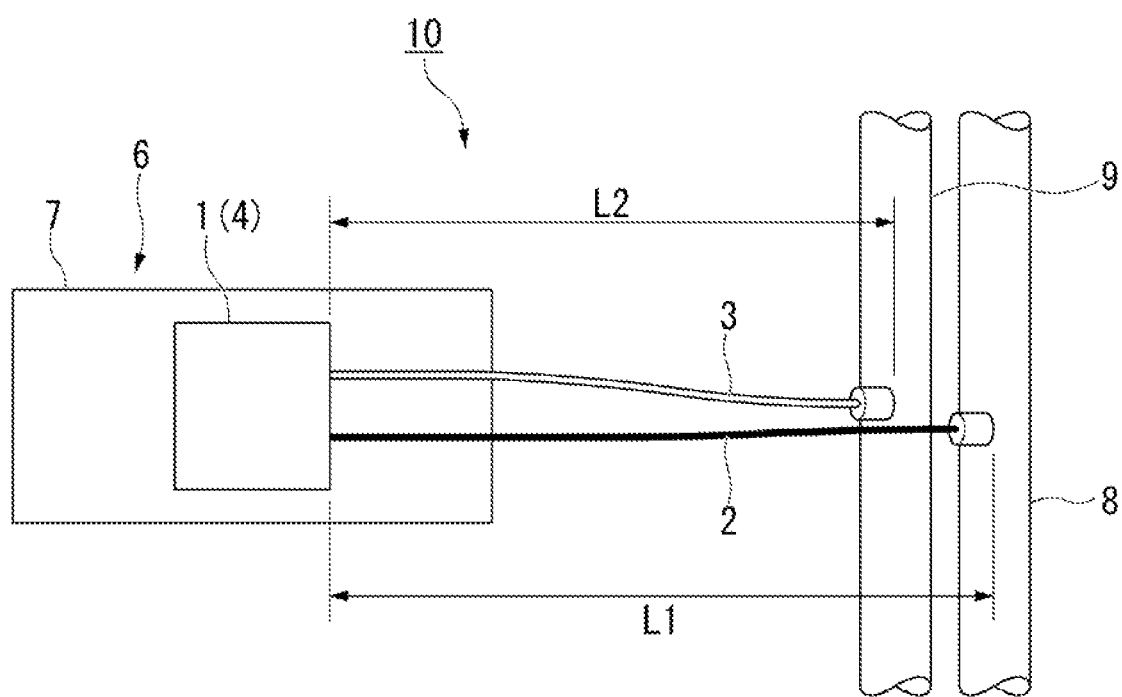
FIG. 3 is a diagram illustrating the minimum structure of a device according to a third embodiment.

FIG. 3 is a diagram illustrating the minimum structure of a device according to a third embodiment.

As illustrated in this drawing, it is sufficient for the device 10 to comprise at least a module 6, a supply tube 8 and a discharge tube 9.

The module 6 is similar to that indicated in the above-described second embodiment. In other words, the module 6 comprises at least a substrate 7, a cooling unit 1, a supply connection tube 2 and a discharge connection tube 3.

A heat-generating component 4 is mounted on the substrate 7. The cooling unit 1 cools the heat-generating component 4.

The supply connection tube 2 is connected to the cooling unit 1. The supply connection tube 2 supplies a cooling medium to the cooling unit 1. The discharge connection tube 3 is connected to the cooling unit 1. The discharge connection tube 3 discharges the cooling medium from the cooling unit 1. The supply connection tube 2 and the discharge connection tube 3 have mutually different lengths.

The supply connection tube 2 is connected to the supply tube 8. The discharge connection tube 3 is connected to the discharge tube 9. The supply tube 8 and the discharge tube 9 are provided at different positions, so that a distance L1 between the cooling unit 1 and the supply tube 8, and a distance L2 between the cooling unit 1 and the discharge tube 9 are different.

In this device 10, in addition to the supply connection tube 2 and the discharge connection tube 3 having different lengths, the distance L1 between the cooling unit 1 and the supply tube 8 is also different from the distance L2 between the cooling unit 1 and the discharge tube 9. Thus, in addition to being able to easily and reliably distinguish between the supply connection tube 2 and the discharge connection tube 3 visually, it is possible to easily and reliable distinguish between the supply tube 8 and the discharge tube 9, to which one of the supply connection tube 2 and the discharge connection tube 3 is to be connected. Therefore, it is possible to suppress situations in which the supply tube 8 and the discharge tube 9, to which one of the supply connection tube 2 and the discharge connection tube 3 is to be connected, are misrecognized and confused with each other. As a result thereof, in a structure in which the supply connection tube 2 and the discharge connection tube 3 can be independently inserted and withdrawn, it is possible to prevent erroneous connections of the supply connection tube 2 and the discharge connection tube 3.

Fourth Embodiment

Figure 4:
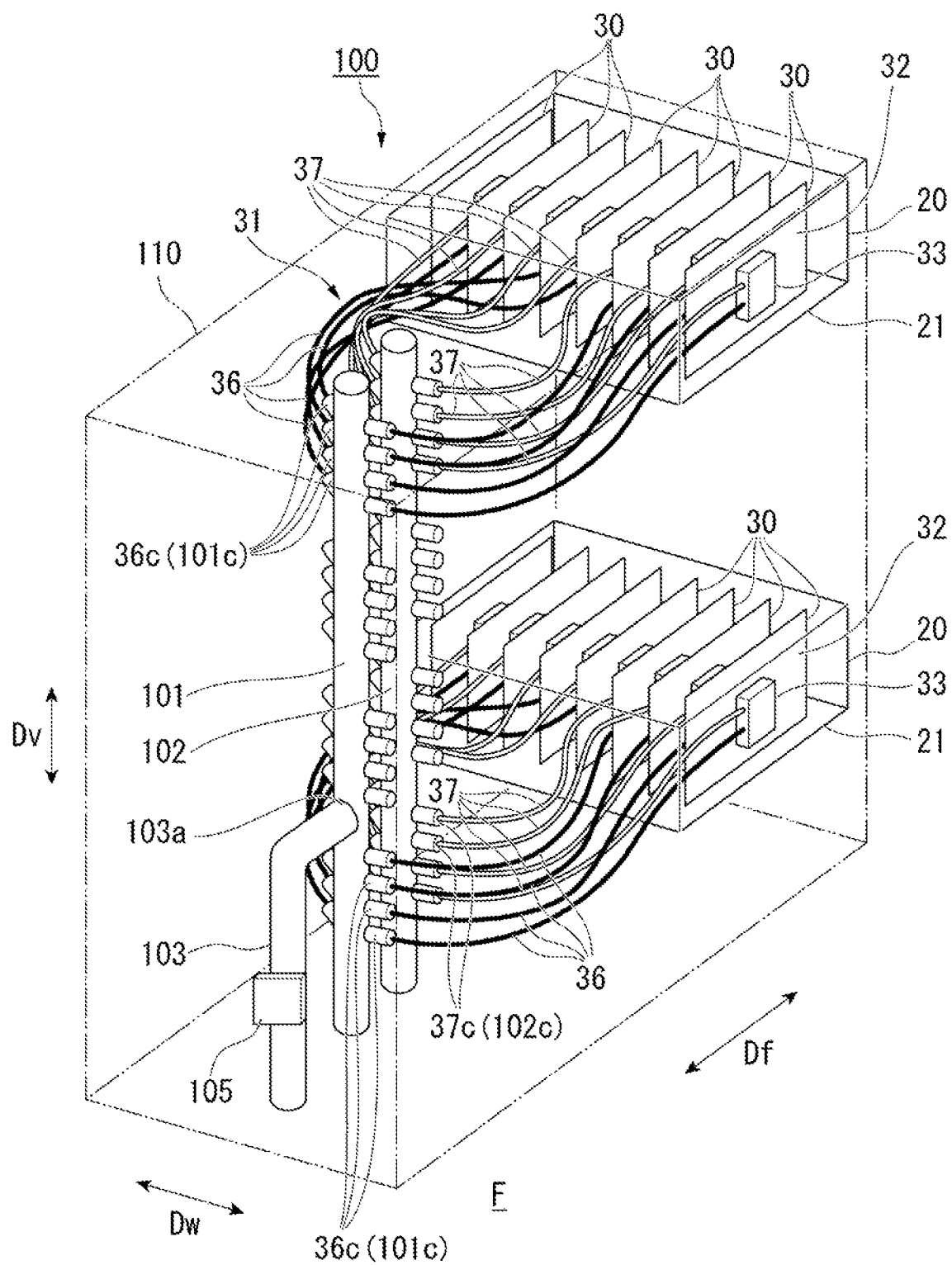
FIG. 4 is a perspective view illustrating the structure of a server device according to a fourth embodiment.

FIG. 4 is a perspective view illustrating the structure of a server device according to a fourth embodiment.

As illustrated in FIG. 4, the server device (device) 100 in the fourth embodiment comprises a rack 110 and servers 20 housed inside the rack 110. The server device 100 houses a plurality of servers 20 arranged in the vertical direction inside the rack 110.

Each server 20 has a rectangular parallelepiped-shaped enclosure 21. The enclosures 21 are supported so as to be able to move in the front-rear direction Df inside the rack 110 by means of slide rails (not illustrated).

Inside the rack 110, a supply tube 101 and a discharge tube 102 are provided to the rear, in the front-rear direction Df, with respect to the enclosures 21 of the servers 20. The supply tube 101 and the discharge tube 102 both extend in the vertical direction Dv. The supply tube 101 supplies, for example, cooling water, as a cooling medium, to the server device 100. The discharge tube 102 discharges the cooling water from the server device 100.

A water supply tube 103 is connected to the supply tube 101, the water supply tube 103 supplying cooling water from the facility in which the server device 100 is installed. The water supply tube 103 rises upward from a floor surface F and a tip portion 103a thereof is connected to a middle portion, in the vertical direction Dv, of the supply tube 101. On the water supply tube 103, a flow rate sensor 105 is provided between the floor surface F and the tip portion 103a. The flow rate sensor 105 monitors the flow rate of the cooling water supplied to the server device 100.

Thus, by connecting the tip portion 103a of the water supply tube 103 to the middle portion, in the vertical direction Dv, of the supply tube 101, the flow rate sensor 105 can be provided between the floor surface F and the tip portion 103a of the water supply tube 103. Therefore, there is no need to form a hole or the like in the floor surface F in order to install the flow rate sensor 105, and the flow rate sensor 105 can be easily provided while making effective use of the space inside the rack 110.

Figure 5:
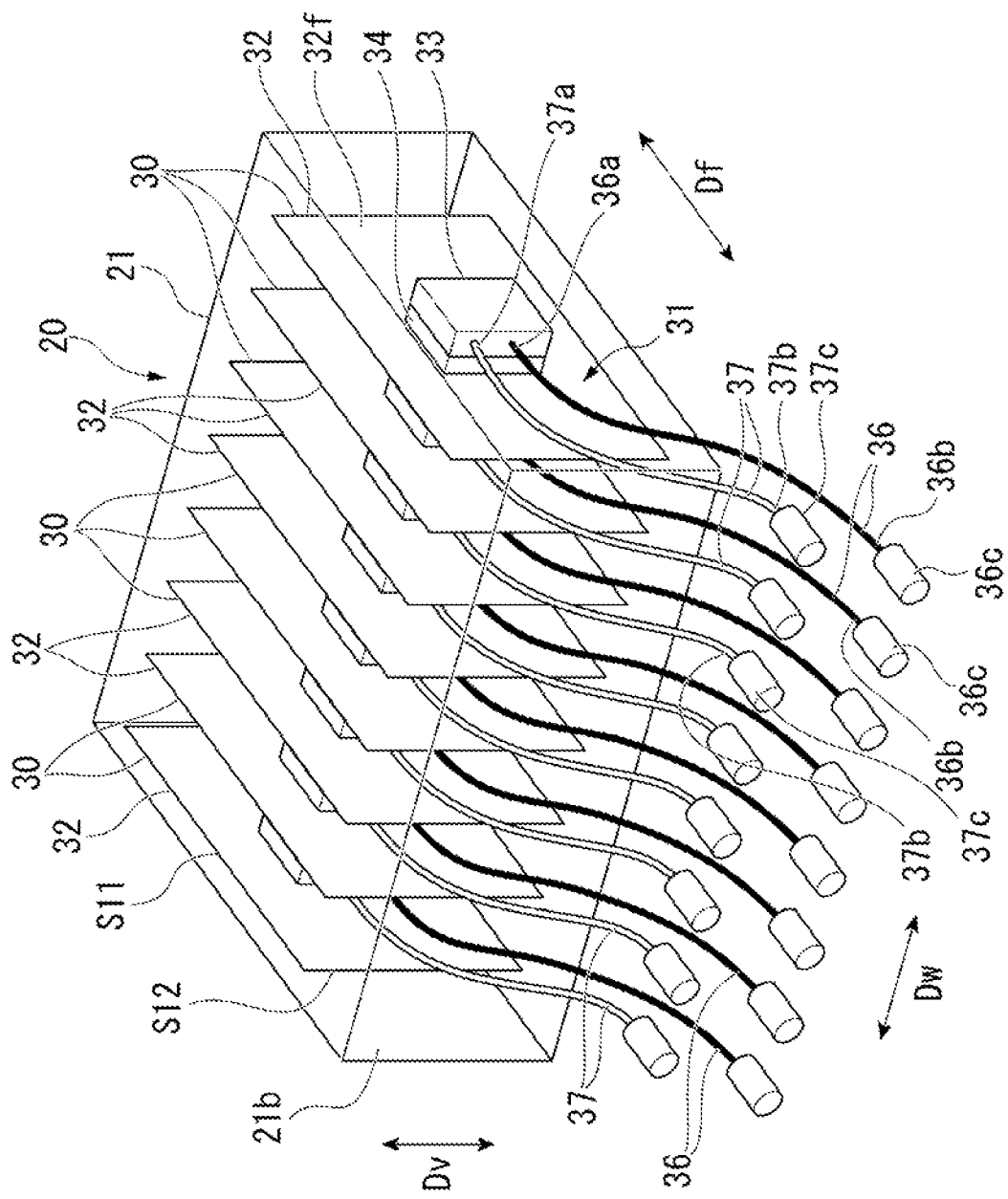
FIG. 5 is a perspective view illustrating the structure of a server according to the fourth embodiment.
Figure 6:
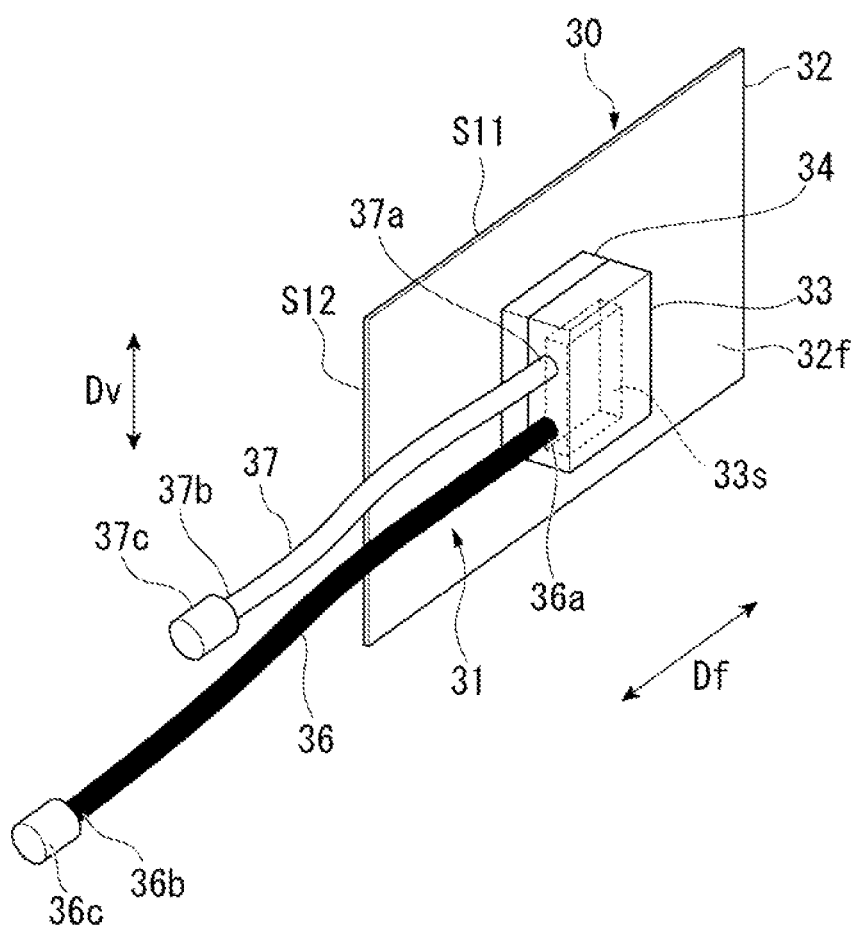
FIG. 6 is a perspective view illustrating the structure of a module provided inside the server according to the fourth embodiment.
Figure 7:
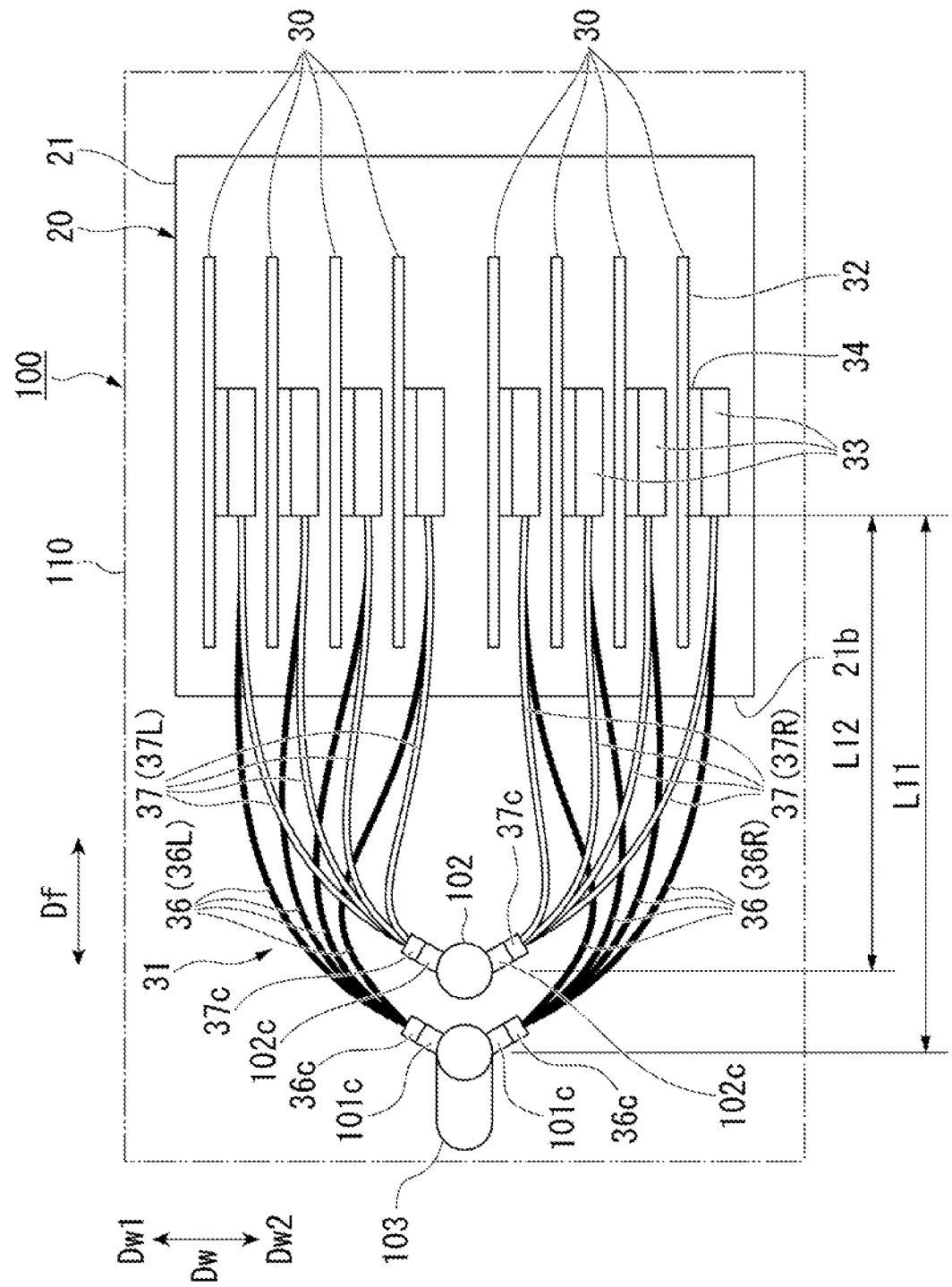
FIG. 7 is a horizontal section view illustrating the structure of the server device according to the fourth embodiment.

FIG. 5 is a perspective view illustrating the structure of a server according to the fourth embodiment. FIG. 6 is a perspective view illustrating the structure of a module provided inside the server according to the fourth embodiment. FIG. 7 is a horizontal section view illustrating the structure of the server device according to the fourth embodiment. FIG. 8 is a side section view illustrating the structure of the server device according to the fourth embodiment.

As illustrated in FIG. 5, the server 20 comprises a plurality of electronic components, such as modules 30, inside the enclosure 21.

As illustrated in FIGS. 5 and 6, a module 30 comprises a substrate 32, a cooling unit 33, a supply connection tube 36 and a discharge connection tube 37.

The substrate 32 is in the shape of a rectangular plate. The substrate 32 is arranged so that, in a state in which the module 30 is housed within the enclosure 21, a long edge S11 is aligned with the front-rear direction Df and a short edge S12 is aligned with the vertical direction Dv. The substrate 32 is connected, so as to be able to be inserted and withdrawn, to a base substrate (not illustrated) that is arranged along the bottom surface of the enclosure 21.

The substrate 32 has a heat-generating component 34 such as a CPU (Central Processing Unit). The heat-generating component 34 is mounted on one surface 32f of the substrate 32.

A cooling unit 33 is provided on the substrate 32. The cooling unit 33 is provided so as to be stacked on the heat-generating component 34. The cooling unit 33 cools the heat-generating component 34. The cooling unit 33 has a prescribed thickness in the direction orthogonal to the one surface 32f of the substrate 32. The cooling unit 33 has a recess 33s on the side facing the heat-generating component 34. The recess 33s faces at least a portion of the surface of the heat-generating component 34.

As illustrated in FIG. 5 to FIG. 8, each supply connection tube 36 has one end 36a connected to a cooling unit 33. The supply connection tube 36 extends to the outside of the substrate 32. The supply connection tube 36 extends from the substrate 32, through the rear surface 21b located at the rear, in the front-rear direction Df, of the enclosure 21, and rearward from the enclosure 21. The supply connection tube 36 has a connection elbow 36c on the other end 36b that extends rearward from the enclosure 21. The connection elbow 36c is detachably connected to a connection joint 101c formed on the supply tube 101.

Cooling water is fed to the supply connection tube 36 through the water supply tube 103 and the supply tube 101. The supply connection tube 36 supplies cooling water that has been fed from the supply tube 101 to the recess 33s in the cooling unit 33.

The discharge connection tube 37 has one end 37a connected to the cooling unit 33. The discharge connection tube 37 extends to the outside of the substrate 32. The discharge connection tube 37 extends from the substrate 32, through the rear surface 21b located at the rear, in the front-rear direction Df, of the enclosure 21, and rearward from the enclosure 21. The discharge connection tube 37 has a connection elbow 37c on the other end 37b that extends rearward from the enclosure 21. The connection elbow 37c is detachably connected to a connection joint 102c provided on the discharge tube 102.

The discharge connection tube 37 discharges cooling water from the recess 33s in the cooling unit 33. The cooling water that is discharged through the discharge connection tube 37 is discharged to the outside through the discharge tube 102.

The discharge connection tube 37 is connected to the discharge tube (not illustrated) that discharges cooling water to the outside.

A cooling system 31 of the module 30 is formed by the cooling unit 33, the supply connection tube 36 and the discharge connection tube 37 mentioned above.

In this cooling system 31, the supply connection tube 36 and the discharge connection tube 37 have mutually different lengths. In the present embodiment, the supply connection tube 36 is longer, by a predetermined standard length, than the discharge connection tube 37 is.

As illustrated in FIG. 5 and FIG. 7, a plurality of modules 30 as mentioned above are housed inside the enclosure 21 of each server 20. Inside the enclosure 21, the plurality of modules 30 are arranged so as to be spaced in the width direction Dw, which is orthogonal to the front-rear direction Df and the vertical direction Dv.

Thus, the supply connection tubes 36 and the discharge connection tubes 37 of a plurality of modules 30 extend rearward from the rear surface 21b of the enclosure 21 of each server 20. The respective supply connection tubes 36 that extend from the plurality of modules 30 are connected to the supply tube 101, which is located to the rear inside the rack 110. Additionally, the discharge connection tubes 37 are connected to the discharge tube 102, which is located to the rear inside the rack 110.

In each server 20, the lengths of the supply connection tubes 36 are the same for the plurality of modules 30. Additionally, the lengths of the discharge connection tubes 37 are the same for the plurality of modules 30.

The supply tube 101 and the discharge tube 102 are provided at a central portion, in the width direction Dw, of the enclosure 21. Furthermore, as illustrated in FIG. 7 and FIG. 8, the supply tube 101 and the discharge tube 102 are arranged so as to be side-by-side in the front-rear direction Df. In the present embodiment, the supply tube 101 is provided to the rear, in the front-rear direction Df, relative to the discharge tube 102. Thus, the supply tube 101 and the discharge tube 102 are respectively provided at positions such that the distance L11 between the cooling units 33 and the supply tube 101, and the distance L12 between the cooling units 33 and the discharge tube 102 are different. In other words, the distance L11 between the cooling units 33 and the supply tube 101 is greater than the distance L12 between the cooling units 33 and the discharge tube 102.

Thus, the supply connection tubes 36, which are longer than the discharge connection tubes 37, are connected to the supply tube 101, which is at a greater distance L11 from (farther from) the cooling units 33. Additionally, the discharge connection tubes 37, which are shorter than the supply connection tubes 36, are connected to the discharge tube 102, which is at a smaller distance L12 from (closer to) the cooling units 33.

In this case, it is preferable for the discharge connection tubes 37, which are shorter than the supply connection tubes 36, to be set to have a length not reaching the supply tube 101, which is at the greater distance L11 from the cooling units 33. For example, the lengths of the discharge connection tubes 37 are lengths such that the discharge tube 102 can be reached but the supply tube 101 cannot be reached.

In each server 20, the plurality of supply connection tubes 36 connected to the plurality of cooling units 33 on the plurality of modules 30 have connection positions, on the supply tube 101, that are different from each other. The supply connection tubes 36 connected respectively to the plurality of cooling units 33 have connection positions, on the supply tube 101, that are different from each other. Additionally, in each server 20, the plurality of discharge connection tubes 37 connected to the plurality of cooling units 33 on the plurality of modules 30 have connection positions, on the discharge tube 102, that are different from each other. The discharge connection tubes 37 connected respectively to the plurality of cooling units 33 have connection positions, on the discharge tube 102, that are different from each other.

Specifically, the plurality of supply connection tubes 36 and discharge connection tubes 37 on the servers 20 respectively have connection positions, on the supply tube 101 and the discharge tube 102, that are provided at a plurality of different locations at positions that are different from each other in the circumferential direction. For example, the connection positions, in the circumferential direction, of the supply connection tubes 36 and the discharge connection tubes 37 on the supply tube 101 and the discharge tube 102, respectively, are provided at a plurality of locations that are different from each other. In the present embodiment, as illustrated in FIG. 7, the plurality of supply connection tubes 36 and discharge connection tubes 37, when viewing their respective connection positions on the supply tube 101 and the discharge tube 102 in the vertical direction Dv, are provided at two locations at positions that are different from each other in the circumferential direction. In other words, the supply tube 101 and the discharge tube 102 have connection joints 101c, 102c that protrude diagonally towards one side Dw1 in the width direction Dw relative to the front-rear direction Df, and connection joints 101c, 102c that protrude diagonally towards the other side Dw2 in the width direction Dw relative to the front-rear direction Df. The number of locations of the connection positions at different positions in the circumferential direction is not limited to being two locations. The number of locations may be any number as long as there are a plurality.

Among the plurality of supply connection tubes 36 and discharge connection tubes 37 in each server 20, the connection tube groups 36L, 37L comprising the supply connection tubes 36 and the discharge connection tubes 37 that extend rearward from the one side Dw1 in the width direction Dw are respectively connected to the connection joints 101c, 102c that protrude diagonally towards the one side Dw1 in the width direction Dw. The connection tube groups 36R, 37R comprising the supply connection tubes 36 and the discharge connection tubes 37 that extend rearward from the other side Dw2 in the width direction Dw are respectively connected to the connection joints 101c, 102c that protrude diagonally towards the other side Dw2 in the width direction Dw.

Thus, the connection tube groups 36L, 37L extending rearward from the one side Dw1 in the width direction Dw and the connection tube groups 36R, 37R extending rearward from the other side Dw2 in the width direction Dw, when viewed from the vertical direction Dv, are divided in two in the circumferential direction. In other words, the plurality of supply connection tubes 36 and discharge connection tubes 37 are divided into the connection tube groups 36L, 37L and the connection tube groups 36R, 37R having different connection positions in the circumferential direction.

In this way, in accordance with the positions of the respective modules 30 in the width direction Dw, the other ends 36b, 37b of the supply connection tubes 36 and the discharge connection tubes 37 on the sides towards the supply tube 101 and the discharge tube 102 can be directed towards the sides on which the modules 30, to which the one ends of the 36a, 37a of those supply connection tubes 36 and discharge connection tubes 37 are to be connected, are positioned. Thus, the supply connection tubes 36 and the discharge connection tubes 37 can be routed so as not to apply so much force that the supply connection tubes 36 and the discharge connection tubes 37 are excessively bent. In other words, the supply connection tubes 36 and the discharge connection tubes 37 can be arranged without excessively bending the supply connection tubes 36 and the discharge connection tubes 37.

As illustrated in FIG. 8, the plurality of supply connection tubes 36 and discharge connection tubes 37 in each server 20 have connection positions, respectively, on the supply tube 101 and the discharge tube 102, that are different from each other in the vertical direction Dv. On the supply tube 101 and the discharge tube 102, the connection joints 101c, 102c to which the plurality of supply connection tubes 36 and discharge connection tubes 37 of each server 20 are respectively connected are provided so as to be spaced in the vertical direction Dv.

In this case, as illustrated in FIG. 7, when viewed from the vertical direction Dv, the distances from the cooling units 33 to the supply tube 101 and the discharge tube 102 are different from each other between the plurality of modules 30 at different positions in the width direction Dw inside the server 20.

Therefore, the connection joints 101c, 102c are arranged so that the height differences in the vertical direction Dv relative to the one ends 36a, 37a of the supply connection tubes 36 and the discharge connection tubes 37 are small for the connection joints 101c, 102c connected to the supply connection tubes 36 and the discharge connection tubes 37 extending from the modules 30 in which the distances from the cooling units 33 to the supply tube 101 and the discharge tube 102 are large. The connection joints 101c, 102c are arranged so that the height differences in the vertical direction Dv relative to the one ends 36a, 37a of the supply connection tubes 36 and the discharge connection tubes 37 are large for the connection joints 101c, 102c connected to the supply connection tubes 36 and the discharge connection tubes 37 extending from the modules 30 in which the distances from the cooling units 33 to the supply tube 101 and the discharge tube 102 are small.

In the case of the present embodiment, the supply tube 101 and the discharge tube 102 are provided in the central portion in the width direction Dw. For this reason, the distances to the modules 30 positioned on the outer sides in the width direction Dw are longer and the distances to the modules 30 positioned on the inner sides in the width direction Dw are shorter.

Therefore, as illustrated in FIG. 4 and FIG. 8, the height differences in the vertical direction Dv with respect to the one ends 36a, 37a of the supply connection tubes 36 and the discharge connection tubes 37 are made smaller for the connection joints 101c, 102c to which the supply connection tubes 36 and the discharge connection tubes 37 of the modules 30 positioned on the outer sides in the width direction Dw are connected. For example, the supply connection tubes 36 and the discharge connection tubes 37 of the modules 30 that are positioned further on the outer sides are connected to connection joints 101c, 102c at the same heights as the one ends 36a, 37a.

The height differences in the vertical direction Dv with respect to the one ends 36a, 37a of the supply connection tubes 36 and the discharge connection tubes 37 are made larger for the connection joints 101c, 102c to which the supply connection tubes 36 and the discharge connection tubes 37 of the modules 30 positioned towards the center in the width direction Dw are connected. For example, the supply connection tubes 36 and the discharge connection tubes 37 of the modules 30 that are positioned further on the inner sides are connected to connection joints 101c, 102c at higher or lower heights.

Thus, among the supply connection tubes 36 and discharge connection tubes extending from the plurality of modules 30 in each server 20, the distances from the one ends 36a, 37a on the sides towards the modules 30 to the other ends 36b, 37b on the sides towards the supply tube 101 and the discharge tube 102 are made as uniform as possible. In other words, the lengths of the supply connection tubes 36 and the discharge connection tubes 37 can easily be made uniform between the plurality of modules 30 having different positions in the width direction Dw.

In this cooling system 31, modules 30 and server device 100, the lengths of the supply connection tubes 36 and the discharge connection tubes 37 are different. Thus, the supply connection tubes 36 and the discharge connection tubes 37 can be easily and reliably distinguished visually. Therefore, it is possible to suppress situations in which the supply connection tubes 36 and the discharge connection tubes 37 are misrecognized and the supply tube 101 and the discharge tube 102, to which they are to be connected, are confused with each other. As a result thereof, in a structure in which the supply connection tubes 36 and the discharge connection tubes 37 can be independently inserted and withdrawn, erroneous connections of the supply connection tubes 36 and the discharge connection tubes 37 can be prevented.

In this server device 100, the supply tube 101 and the discharge tube 102 are respectively arranged so that the distance L11 between the cooling units 33 and the supply tube 101 and the distance L12 between the cooling units 33 and the discharge tube 102 are different. Thus, it is possible to easily and reliably distinguish visually between supply connection tubes 36 and discharge connection tubes 37, as well as to easily and reliably distinguish visually between the supply tube 101 and the discharge tube 102 to which the supply connection tubes 36 or the discharge connection tubes 37 are to be connected. Thus, it is possible to suppress situations in which the supply tube 101 and the discharge tube 102, to which the supply connection tubes 36 or the discharge connection tubes 37 are to be connected, are misrecognized and confused with each other. Therefore, in a structure in which the supply connection tubes 36 and the discharge connection tubes 37 can be independently inserted and withdrawn, erroneous connections of the supply connection tubes 36 and the discharge connection tubes 37 can be prevented.

In this server device 100, the supply connection tubes 36 and discharge connection tubes 37 extending respectively from the plurality of modules 30 provided in the enclosure 21 are respectively connected to the supply tube 101 and the discharge tube 102. Thus, cooling water that is supplied from the supply tube 101 can be supplied so as to be distributed, through the supply connection tubes 36, to the cooling unit 33 in each module 30. Additionally, the cooling water discharged from each cooling unit 33 can be collected, through the discharge connection tubes 37, in the discharge tube 102 and discharged.

In this server device, the supply tube 101 and the discharge tube 102 are provided in a central portion in the width direction Dw of the enclosure 21. Thus, the supply connection tubes 36 and the discharge connection tubes 37 extending from the modules 30 that are arranged so that a plurality are arrayed in the width direction Dw can be collected and connected to the supply tube 101 and the discharge tube 102 positioned at the central portion in the width direction Dw. Thus, there is less need to make the lengths of the supply connection tubes 36 and the discharge connection tubes 37 different between the plurality of modules 30 in comparison to the case in which the supply tube 101 and the discharge tube 102 are arranged towards either end in the width direction Dw inside the rack 110. Therefore, in the present embodiment, it is possible to make the lengths of the supply connection tubes 36 and the lengths of the discharge connection tubes 37 the same between the plurality of modules 30 in each server 20. As a result thereof, it is possible to standardize the components of the supply connection tubes 36 and the discharge connection tubes 37 respectively, thereby suppressing component costs.

In this server device 100, the supply tube 101 and the discharge tube 102 are arranged so as to be side-by-side in the front-rear direction Df. Thus, the distance L11 between the cooling units 33 and the supply tube 101, and the distance L12 between the cooling units 33 and the discharge tube 102 can be made more reliably different. Therefore, the supply tube 101 and the discharge tube 102, to which the supply connection tubes 36 or the discharge connection tubes 37 are to be connected, can be easily and reliably distinguished. Thus, it is possible to suppress situations in which the supply tube 101 and the discharge tube 102, to which the supply connection tubes 36 or the discharge connection tubes 37 are to be connected, are misrecognized and confused with each other. As a result thereof, in a structure in which the supply connection tubes 36 and the discharge connection tubes 37 can be independently inserted and withdrawn, erroneous connections of the supply connection tubes 36 and the discharge connection tubes 37 can be prevented.

In this server device 100, the connection positions of the plurality of supply connection tubes 36 on the supply tube 101 are different from each other between the plurality of modules 30. Additionally, the connection positions of the plurality of discharge connection tubes 37 on the supply tube 102 are different from each other between the plurality of modules 30. The connection positions, respectively, of the supply connection tubes 36 and the discharge connection tubes 37 on the supply tube 101 and the discharge tube 102 are made easier to distinguish.

In this server device 100, the connection positions, respectively, of the supply connection tubes 36 and the discharge connection tubes 37 on the supply tube 101 and the discharge tube 102 are different from each other in the vertical direction Dv between the plurality of modules 30. Thus, on the supply connection tubes 36 and the discharge connection tubes 37 extending from the plurality of modules in each server 20, the distance from the one ends 36a, 37a towards the modules 30 to the other ends 36b, 37b towards the supply tube 101 and the discharge tube 102 are made as uniform as possible. Therefore, the lengths of the supply connection tubes 36 and the lengths of the discharge connection tubes 37 can be made respectively the same between the plurality of modules 30 in each server 20. As a result thereof, it becomes possible to standardize the components of the supply connection tubes 36 and the discharge connection tubes 37 respectively, thereby suppressing component costs.

In this server device 100, the supply connection tubes 36 and the discharge connection tubes 37 are arranged so that the respective connection positions thereof on the supply tube 101 and the discharge tube 102 are at two locations at positions that are different from each other in the circumferential direction.

Thus, in accordance with the positions of the modules 30 in the width direction Dw, the other ends 36b, 37b of the supply connection tubes 36 and the discharge connection tubes 37 on the sides towards the supply tube 101 and the discharge tube 102 can be directed towards the sides on which the modules 30, to which the one ends of the 36a, 37a of those supply connection tubes 36 and discharge connection tubes 37 are to be connected, are positioned. Thus, the supply connection tubes 36 and the discharge connection tubes 37 can be routed so as not to apply so much force that the supply connection tubes 36 and the discharge connection tubes 37 are excessively bent.

Additionally, the connection tube groups 36L, 37L on one side Dw1 in the width direction Dw are divided from the connection tube groups 36R, 37R on the other side Dw2. Thus, a worker's hand can easily reach between the connection tube groups 36L, 37L and the connection tube groups 36R, 37R. Thus, on the rear surface 21b of the enclosure 21, it becomes possible to easily perform attachment and detachment work, other maintenance work or the like, on wiring and the like positioned in the central portion in the width direction Dw.

Additionally, in the above-described embodiments, the modules 30 were provided inside the servers 20, but the number installed and the purposes for which they are used are not limited in any way. Additionally, it is possible to house various electronic components other than modules 30 inside the server 20.

Additionally, in the above-described embodiments, the supply tube 101 and the discharge tube 102 were provided at the central portion in the width direction Dw, but they may be installed at other positions. Furthermore, the supply tube 101 and the discharge tube 102 were provided side-by-side in the front-rear direction Df, but there is no limitation thereto, and other arrangements are possible.

Furthermore, the flow rate sensor 105 is not limited to being on the water supply tube 103 and may be provided on the supply tube 101 or the discharge tube 102. However, a plurality of connection joints 101c, 102c are provided on each of the supply tube 101 and the discharge tube 102. For this reason, there are cases in which the installation position of the flow rate sensor 105 is limited. Additionally, on the side with the discharge tube 102, there are cases in which, for example, bubbles are intermixed with the cooling water due to the attachment or detachment of a module 30 or the like, so it is preferable to provide the flow rate sensor 105 on the water supply tube 103 or the supply tube 101, which are on the upstream side.

Aside therefrom, it is possible to select whether or not to adopt features described in the above-mentioned embodiments, or to appropriately replace some of the features with other features, as long as the invention does not depart from the spirit of the present invention.

INDUSTRIAL APPLICABILITY

The cooling system, module, and device of the present invention make it possible to prevent erroneous connections of supply connection tubes and discharge connection tubes in a structure in which the supply connection tubes and the discharge connection tubes can be independently inserted and withdrawn.

REFERENCE SIGNS LIST

1 Cooling unit
2 Supply connection tube
3 Discharge connection tube
4 Heat-generating component
5 Cooling system
6 Module
7 Substrate
8 Supply tube
9 Discharge tube
10 Device
20 Server
21 Enclosure
30 Module
32 Substrate
33 Cooling unit
34 Heat-generating component
36 Supply connection tube
37 Discharge connection tube
100 Server device (device)
101 Supply tube
102 Discharge tube
110 Rack
Df Front-rear direction
Dv Vertical direction
Dw Width direction
L1, L11 Distance
L2, L12 Distance

The invention claimed is:

1. A device comprising:
one or more modules, each module including:
a substrate on which a heat-generating component is provided;
a cooling unit that cools the heat-generating component;
a supply connection tube that is connected to the cooling unit and that supplies a cooling medium to the cooling unit; and
a discharge connection tube that is connected to the cooling unit and that discharges the cooling medium from the cooling unit,
wherein the supply connection tube and the discharge connection tube have different lengths,
the device further comprises:
a supply tube to which the supply connection tube is connected; and
a discharge tube to which the discharge connection tube is connected,
wherein the supply tube and the discharge tube are provided at positions such that a distance between the cooling unit and the supply tube and a distance between the cooling unit and the discharge tube are different,
the supply tube and the discharge tube are respectively arranged so as to extend in a vertical direction, and
the supply tube and the discharge tube are arranged side-by-side in a front-rear direction orthogonal to the vertical direction and to the width direction of an enclosure.

2. The device according to claim 1, wherein:
the one or more modules include a plurality of modules;
the plurality of modules are housed in the enclosure; and supply connection tubes and discharge connection tubes connected respectively to a plurality of cooling units on the plurality of modules are connected respectively to the supply tube and the discharge tube.

3. The device according to claim 2, wherein:
the supply tube and the discharge tube are provided at a central portion in a width direction of the enclosure.

4. A device comprising:
a plurality of modules, each module including:
- a substrate on which a heat-generating component is provided;
- a cooling unit that cools the heat-generating component;
- a supply connection tube that is connected to the cooling unit and that supplies a cooling medium to the cooling unit and
- a discharge connection tube that is connected to the cooling unit and that discharges the cooling medium from the cooling unit,
- wherein the supply connection tube and the discharge connection tube have different lengths, the device further comprises:
- a supply tube to which the supply connection tube is connected; and
- a discharge tube to which the discharge connection tube is connected,
- wherein the supply tube and the discharge tube are provided at positions such that a distance between the cooling unit and the supply tube and a distance between the cooling unit and the discharge tube are different,
- the supply tube and the discharge tube are respectively arranged so as to extend in a vertical direction,
- supply connection tubes connected respectively to a plurality of cooling units on the plurality of modules have connection positions, on the supply tube, that are different from each other, and
- discharge connection tubes connected respectively to the plurality of cooling units on the plurality of modules have connection positions, on the discharge tube, that are different from each other.

5. The device according to claim 4, wherein:
the connection positions of the supply connection tubes and the discharge connection tubes, respectively, on the supply tube and the discharge tube are different from each other in the vertical direction.

6. The device according to claim 4, wherein:
the connection positions of the supply connection tubes and the discharge connection tubes, respectively, on the supply tube and the discharge tube are provided at a plurality of locations at positions that are different from each other in the circumferential direction.

7. The device according to claim 4, wherein:
the plurality of modules are housed in an enclosure; and
the supply connection tubes and the discharge connection tubes connected respectively to the plurality of cooling units on the plurality of modules are connected respectively to the supply tube and the discharge tube.

8. The device according to claim 7, wherein:
the supply tube and the discharge tube are provided at a central portion in a width direction of the enclosure.

\* \* \* \* \*